United States Patent
Jo et al.

(10) Patent No.: US 12,520,455 B2
(45) Date of Patent: Jan. 6, 2026

(54) SYSTEM, APPARATUS, AND METHOD WITH IMMERSION COOLING

(71) Applicant: SAMSUNG ELECTRONICS CO., LTD., Suwon-si (KR)

(72) Inventors: Sungeun Jo, Suwon-si (KR); Byungwoo Bang, Suwon-si (KR); Junyeon Lee, Suwon-si (KR); Wooseok Chang, Suwon-si (KR); Hun Seong Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 269 days.

(21) Appl. No.: 18/357,493

(22) Filed: Jul. 24, 2023

(65) Prior Publication Data
US 2024/0268068 A1    Aug. 8, 2024

(30) Foreign Application Priority Data
Feb. 2, 2023    (KR) ........................ 10-2023-0014128

(51) Int. Cl.
*H05K 7/20*    (2006.01)

(52) U.S. Cl.
CPC ..... *H05K 7/20281* (2013.01); *H05K 7/20236* (2013.01); *H05K 7/20272* (2013.01)

(58) Field of Classification Search
CPC ........... H05K 7/20236; H05K 7/20272; H05K 7/20281; H05K 7/203; H05K 7/20763; H05K 7/20781
See application file for complete search history.

(56) References Cited

U.S. PATENT DOCUMENTS

| | | | |
|---|---|---|---|
| 10,653,036 B1 | 5/2020 | Gao | |
| 10,912,222 B2 | 2/2021 | Inano et al. | |
| 10,939,580 B2* | 3/2021 | Gao | ........................ G06F 1/206 |
| 11,395,438 B1* | 7/2022 | Gao | .................. H05K 7/20772 |
| 2015/0351281 A1* | 12/2015 | Campbell | .......... H05K 7/20781 |
| | | | 29/890.035 |
| 2020/0015383 A1* | 1/2020 | Gao | .................. H05K 7/20763 |
| 2021/0084797 A1* | 3/2021 | Shao | ........................ G06F 1/206 |

(Continued)

FOREIGN PATENT DOCUMENTS

| | | |
|---|---|---|
| JP | 2019-212826 A | 12/2019 |
| JP | 2021-034555 A | 3/2021 |
| KR | 10-2206706 B1 | 1/2021 |

*Primary Examiner* — Eric S Ruppert
*Assistant Examiner* — Hans R Weiland
(74) *Attorney, Agent, or Firm* — NSIP Law (57) ABSTRACT

An immersion cooling system including an electronic device including a plurality of boards, the electronic device being configured in the immersive cooling system to be immersed in refrigerant that a reservoir is configured to accommodate, a pump array including a plurality of pumps disposed inside the reservoir, each pump of the plurality of pumps configured to individually generate a flow of the refrigerant by performing a discharging of the refrigerant, and a controller, the controller being configured to individually control an operation of each pump of the plurality of pumps, determine a board of the plurality of boards that requires cooling, identify a pump corresponding to the determined board among the plurality of pumps, and increase a flow quantity of the refrigerant discharged from the identified pump.

17 Claims, 6 Drawing Sheets

(56) References Cited

U.S. PATENT DOCUMENTS

| | | | |
|---|---|---|---|
| 2023/0240053 A1* | 7/2023 | Turner | H05K 7/20763 |
| 2023/0301027 A1* | 9/2023 | Gao | H05K 7/20836 361/700 |

* cited by examiner

SYSTEM, APPARATUS, AND METHOD WITH IMMERSION COOLING

CROSS-REFERENCE TO RELATED APPLICATIONS

This application claims the benefit under 35 USC § 119(a) of Korean Patent Application No. 10-2023-0014128, filed on Feb. 2, 2023, in the Korean Intellectual Property Office, the entire disclosure of which is incorporated herein by reference for all purposes.

BACKGROUND

1. Field

The following description relates to a system, apparatus, and method with immersion cooling.

2 Description of Related Art

Typical methods of cooling a board may employ air cooling or liquid cooling. However, it is difficult to cool a board of a supercomputer that may be equipped with chips that may consume tens to hundreds of watts by typical air cooling or liquid cooling methods. Instead, an immersion cooling method may be employed to control the heat generated by a supercomputer board. The typical immersion cooling method may cool the board through circulation of a refrigerant in a state where the board is put into the refrigerant including an insulating fluid. The immersion cooling method may also be employed in cooling boards for executing a high-power application included in a high-performance computing (HPC) or for servers.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, here is provided an immersion cooling system including an electronic device including a plurality of boards, the electronic device being configured in the immersive cooling system to be immersed in refrigerant that a reservoir is configured to accommodate, a pump array including a plurality of pumps disposed inside the reservoir, each pump of the plurality of pumps configured to individually generate a flow of the refrigerant by performing a discharging of the refrigerant, and a controller, the controller being configured to individually control an operation of each pump of the plurality of pumps, determine a board of the plurality of boards that requires cooling, identify a pump corresponding to the determined board among the plurality of pumps, and increase a flow quantity of the refrigerant discharged from the identified pump.

The refrigerant may include an insulation fluid, the refrigerant having characteristics to release heat absorbed from a surface of the determined board.

A total number of the plurality of pumps of the pump array is equal to a total number of the plurality of boards of the electronic device, and each of the plurality of pumps is disposed at a position to discharge the refrigerant toward a respective board among the plurality of boards.

The controller may be configured to periodically receive a respective workload assigned to each of the plurality of boards and determine, for each board of the plurality of boards, whether a corresponding board, of the plurality of boards, requires cooling based on the respective workload assigned to the corresponding board.

For each board of the plurality of boards, the determination of whether corresponding board requires cooling may be based on whether the respective workload being determined to be greater than or equal to a respective threshold workload set for the corresponding board.

The controller may be configured to individually set the respective threshold workload for each of the corresponding boards.

For each board of the plurality of boards, the controller may be configured to increase a respective flow quantity of the refrigerant discharged from a respective pump corresponding to the corresponding board in a corresponding time interval, the corresponding time interval including a time point at which the respective workload reaches the respective threshold workload.

The controller may be configured to increase the respective flow quantity of the respective pump corresponding to one of the corresponding boards by a preset flow quantity.

The controller may be configured to increase a sum of flow quantities of multiple pumps corresponding to one of the corresponding boards by a preset flow quantity.

The controller may be configured to increase the respective flow quantity of the respective pump corresponding to one of the corresponding boards as the respective workload assigned to the one corresponding board increases.

The controller may be configured to increase the respective flow quantity of the respective pump corresponding to one of the corresponding boards proportional to a workload obtained by subtracting the respective threshold workload set for the corresponding board from the respective workload assigned to the one corresponding board.

The immersion cooling system may include a plurality of partition walls formed between the plurality of boards to separate flows of the refrigerant toward each of the plurality of boards.

In a general aspect, here is provided a method including determining a board that requires cooling through circulation of a refrigerant among a plurality of boards immersed in the refrigerant that a reservoir is configured to accommodate, identifying a pump corresponding to the determined board among a plurality of pumps disposed inside the reservoir, and increasing a flow quantity of the refrigerant being discharged from the identified pump.

The determining of the board that requires cooling from among the plurality of boards may be based on a workload assigned to each of the plurality of boards, wherein the workload is periodically updated.

The determining of the board that requires cooling among the plurality of boards may include determining whether a corresponding board of the plurality of boards requires cooling based on a respective workload assigned to the corresponding board is greater than or equal to a threshold workload set for the corresponding board, for each of the plurality of boards.

The threshold workload may be set individually for each corresponding board.

The increasing of the flow quantity of the refrigerant may include increasing a respective flow quantity of the refrigerant discharged from a respective pump corresponding to the corresponding board in a corresponding time interval, the corresponding time interval including a time point at which the respective workload reaches the respective threshold workload.

The increasing of the flow quantity of the refrigerant may include increasing the respective flow quantity of the respective pump corresponding to one of the corresponding boards by a preset flow quantity.

The increasing of the flow quantity of the refrigerant may include increasing the respective flow quantity of the respective pump corresponding to one of the corresponding boards as the respective workload assigned to the one corresponding board increases.

A plurality of partition walls may be formed between the plurality of boards to separate flows of the refrigerant toward respective ones of the plurality of boards.

In a general aspect, here is provided a method including selectively activating, for each of a plurality of boards of an electronic device that are disposed to be in contact with a refrigerant, a corresponding one or more pumps, of a plurality of pumps, associated with a corresponding board responsive to a corresponding determination of whether the corresponding board requires cooling.

The plurality of pumps and the plurality of boards may be submerged in a refrigerant.

The method may include, for each of the plurality of boards, performing the determining assessing a respective workload schedule for the corresponding board to determine when the corresponding boards will perform a respective workload that requires a cooling of the corresponding board.

The selective activation of the corresponding one or more pumps further may include selectively increasing or decreasing a flow quantity of refrigerant discharged from the pumps by a flow quantity proportional to a an intensity of the respective workload for the corresponding board.

The method may include performing, for each of the plurality of boards, the determination by determining a respective surface temperature for the corresponding board to determine when the corresponding board requires cooling when the respective surface temperature of the corresponding board exceeds a corresponding predetermined temperature limit.

For one of the plurality of boards, the performing of the determination may include assessing a respective workload schedule for the corresponding board to determine when the corresponding board will perform a workload that requires a cooling of the corresponding board, and the determination that the corresponding board receives cooling is based on a greater one of the respective workload schedule or the respective surface temperature of the corresponding board.

Other features and aspects will be apparent from the following detailed description, the drawings, and the claims.

Throughout the drawings and the detailed description, unless otherwise described or provided, the same, or like, drawing reference numerals may be understood to refer to the same, or like, elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences within and/or of operations described herein are merely examples, and are not limited to those set forth herein, but may be changed as will be apparent after an understanding of the disclosure of this application, except for sequences within and/or of operations necessarily occurring in a certain order. As another example, the sequences of and/or within operations may be performed in parallel, except for at least a portion of sequences of and/or within operations necessarily occurring in an order, e.g., a certain order. Also, descriptions of features that are known after an understanding of the disclosure of this application may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when a component or element is described as being "on", "connected to," "coupled to," or "joined to" another component, element, or layer it may be directly (e.g., in contact with the other component or element) "on", "connected to," "coupled to," or "joined to" the other component, element, or layer or there may reasonably be one or more other components, elements, layers intervening therebetween. When a component or element is described as being "directly on", "directly connected to," "directly coupled to," or "directly joined" to another component or element, there can be no other elements intervening therebetween. Likewise, expressions, for example, "between" and "immediately between" and "adjacent to" and "immediately adjacent to" may also be construed as described in the foregoing.

Although terms such as "first," "second," and "third", or A, B, (a), (b), and the like may be used herein to describe various members, components, regions, layers, or sections, these members, components, regions, layers, or sections are not to be limited by these terms. Each of these terminologies is not used to define an essence, order, or sequence of corresponding members, components, regions, layers, or sections, for example, but used merely to distinguish the corresponding members, components, regions, layers, or sections from other members, components, regions, layers, or sections. Thus, a first member, component, region, layer, or section referred to in the examples described herein may also be referred to as a second member, component, region, layer, or section without departing from the examples.

The terminology used herein is for describing various examples only and is not to be used to limit the disclosure. The articles "a," "an," and "the" are intended to include the plural forms as well, unless the context clearly indicates otherwise. As non-limiting examples, terms "comprise" or "comprises," "include" or "includes," and "have" or "has" specify the presence of stated features, numbers, operations, members, elements, and/or combinations thereof, but do not preclude the presence or addition of one or more other features, numbers, operations, members, elements, and/or combinations thereof, or the alternate presence of an alternative stated features, numbers, operations, members, elements, and/or combinations thereof. Additionally, while one embodiment may set forth such terms "comprise" or "comprises," "include" or "includes," and "have" or "has" specify the presence of stated features, numbers, operations, members, elements, and/or combinations thereof, other embodiments may exist where one or more of the stated features, numbers, operations, members, elements, and/or combinations thereof are not present.

As used herein, the term "and/or" includes any one and any combination of any two or more of the associated listed items. The phrases "at least one of A, B, and C", "at least one of A, B, or C", and the like are intended to have disjunctive meanings, and these phrases "at least one of A, B, and C", "at least one of A, B, or C", and the like also include examples where there may be one or more of each of A, B, and/or C (e.g., any combination of one or more of each of A, B, and C), unless the corresponding description and embodiment necessitates such listings (e.g., "at least one of A, B, and C") to be interpreted to have a conjunctive meaning.

Due to manufacturing techniques and/or tolerances, variations of the shapes shown in the drawings may occur. Thus, the examples described herein are not limited to the specific shapes shown in the drawings, but include changes in shape that occur during manufacturing.

Unless otherwise defined, all terms, including technical and scientific terms, used herein have the same meaning as commonly understood by one of ordinary skill in the art to which this disclosure pertains and based on an understanding of the disclosure of the present application. Terms, such as those defined in commonly used dictionaries, are to be interpreted as having a meaning that is consistent with their meaning in the context of the relevant art and the disclosure of the present application and are not to be interpreted in an idealized or overly formal sense unless expressly so defined herein. The use of the term "may" herein with respect to an example or embodiment, e.g., as to what an example or embodiment may include or implement, means that at least one example or embodiment exists where such a feature is included or implemented, while all examples are not limited thereto.

An example immersion cooling method may cool the board through circulation of a refrigerant in a state where the board is put into the refrigerant including an insulating fluid. The immersion cooling method may also be employed in cooling boards for executing a high-power application included in a high-performance computing (HPC) or for servers.

Figure 1:
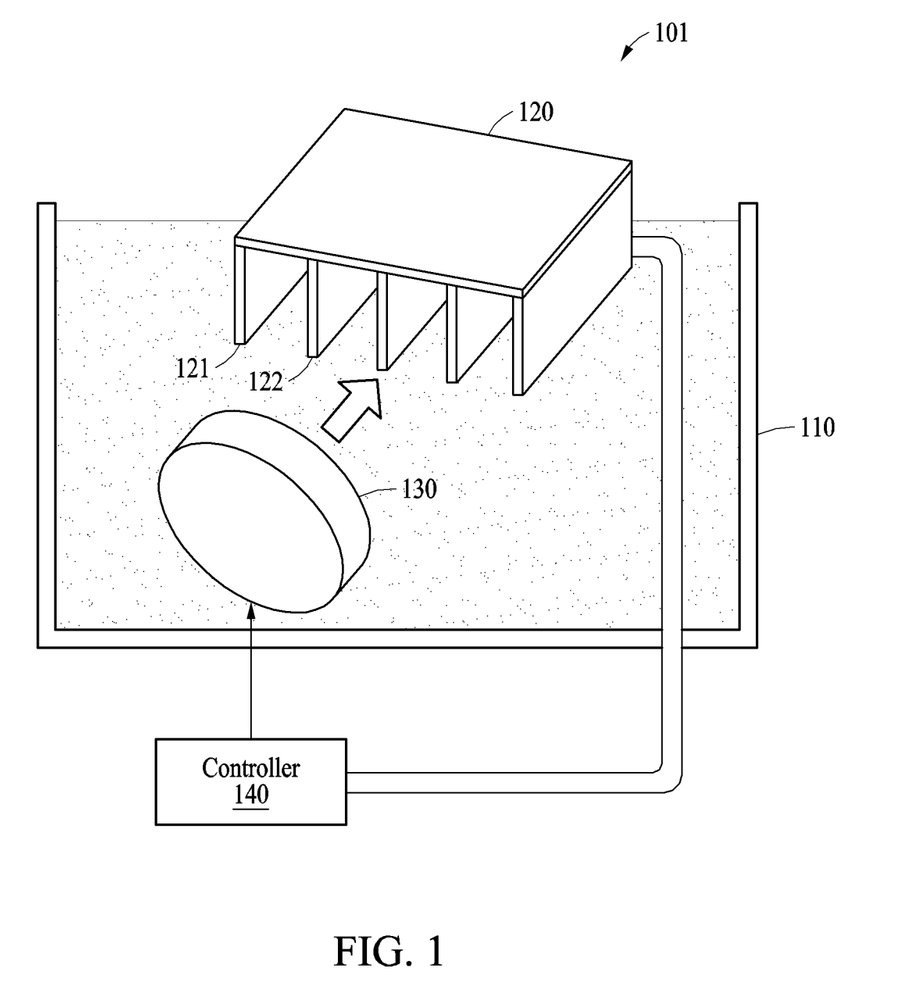
FIG. 1 illustrates an example immersion cooling system according to one or more embodiments.

FIG. 1 illustrates a comparative example immersion cooling system 101 according to one or more embodiments.

In an example, the immersion cooling system 101 may include a reservoir 110 configured to store a refrigerant, an electronic device 120 including a plurality of boards (e.g., boards 121 and 122) immersed in the refrigerant, a single pump 130 disposed inside the reservoir 110 and generating a flow of the refrigerant by drawing in (e.g., ingesting) and discharging a portion of the refrigerant, and a controller 140 configured to control an operation of the single pump 130. In an example, a board (e.g., the boards 121 and 122) may represent electronic components that may be mounted on a main board. As a non-limiting example, the board may include electronic components or electronic devices including a central processing unit (CPU) or a graphics processing unit (GPU). The board may generate heat during operation, and if the board were to overheat due to the generated heat, the board may malfunction. In an example, in the immersion cooling system 101, the board of electronic device 120 immersed in the refrigerant may be cooled by the refrigerant.

In an example, the controller 140 may control the single pump 130 to draw the refrigerant in and discharges the drawn-in refrigerant toward the plurality of boards (e.g., the boards 121 and 122) included in the electronic device 120. In an example, the single pump 130 may circulate the refrigerant around, through, or towards the plurality of boards. The controller 140 may adjust the operation of the single pump 130 to change a flow quantity of the refrigerant being discharged by the single pump 130. That is, in an example, the controller 140 may increase or decrease the flow quantity of the refrigerant discharged by the single pump 130 based on a temperature measured for the plurality of boards. The controller 140 may determine whether cooling is required for each of the plurality of boards based on the temperature measured for the plurality of boards. Since the temperature of each of the plurality of boards changes in real time, the controller 140 may periodically, or continuously, determine whether cooling is required for each of the plurality of boards.

In an example, when the controller 140 determines that additional cooling is required for one board (e.g., the board 121) included in the electronic device 120 while the single pump 130 is discharging the refrigerant at a predetermined flow quantity, the controller 140 may instruct the single pump 130 to increase the flow quantity of the refrigerant discharged being discharged by the single pump 130 by a predetermined flow quantity. In another example, when it is determined that cooling is no longer required for one board (e.g., the board 121) while the single pump 130 is discharging the refrigerant at a predetermined flow quantity, the controller 140 may instruct the single pump 130 to decrease the flow quantity of the refrigerant being discharged from the single pump 130 by a predetermined flow quantity. In an example, when the controller 140 determines that the cooling is no longer required, the controller may instruct the single pump 130 to stop circulating, or discharging, the refrigerant.

In an example, the controller 140 may cause the cooling of the plurality of boards (e.g. the boards 121 and 122) included in the electronic device 120 to be performed by the refrigerant discharged from the single pump 130. As the flow quantity of the refrigerant discharged from the single pump 130 increases, the amount of heat released from the plurality of boards (e.g., the boards 121 and 122) included in the electronic device 120 to the refrigerant may increase. The amount of heat released from the board to the refrigerant may be expressed as in Equation 1 below.

$$Q = \dot{m} c_p \Delta T \qquad \text{Equation 1}$$

In Equation 1, Q may indicate the amount of heat released from the board to the refrigerant, $\dot{m}$ may indicate the flow quantity of the refrigerant flowing into the board, $c_p$ may indicate the specific heat of the board, and $\Delta T$ may indicate a temperature change in the board.

In a non-limiting example, the immersion cooling system 101, as only the single pump 130 is disposed inside the reservoir 110, it is difficult to cool one board separately from the other boards. In other words, in the immersion cooling system 101, even when only one board requires cooling, the overall flow of the refrigerant toward each board of the plurality of boards will be increased by operating the single pump 130 disposed inside the reservoir 110. In the immersion cooling system 101 according to an example, since the single pump 130 may generate only one flow of the refrigerant toward the plurality of boards included in the electronic device 120, and may not generate the flow of the refrigerant toward a part of the boards, unnecessary power may be consumed when cooling the boards.

Figure 2:
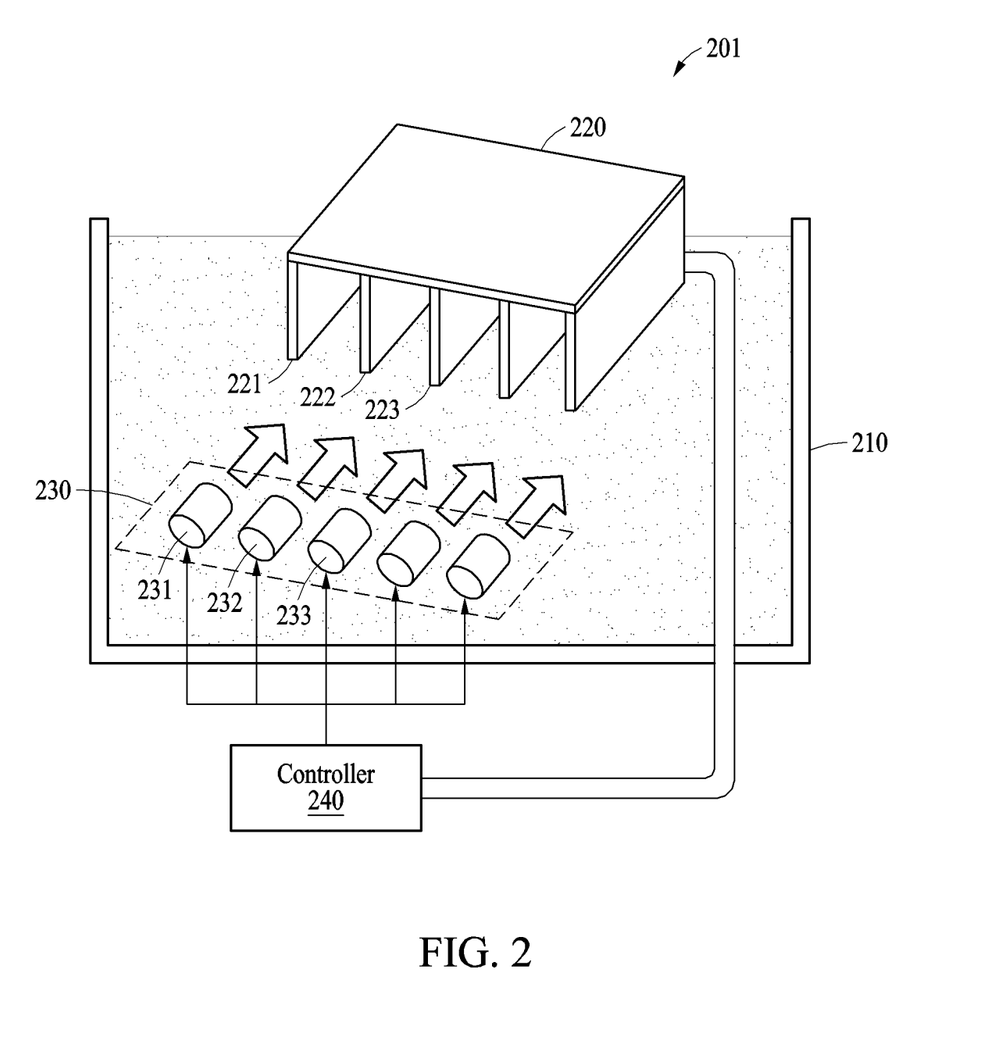
FIG. 2 illustrates an example immersion cooling system according to one or more embodiments.

FIG. 2 illustrates an example immersion cooling system 201 according to one or more embodiments.

Referring to FIG. 2, in a non-limiting example, the immersion cooling system 201 may include a reservoir 210 configured to hold or store a refrigerant, an electronic device 220 including a plurality of boards (e.g., boards 221, 222, and 223) immersed in the refrigerant, a pump array 230 including a plurality of pumps (e.g., pumps 231, 232, and 233) that is disposed inside the reservoir 210, where each pump 231, 232, and 233 of the plurality of pumps of the pump array 230 individually generates a flow of the refrigerant by ingesting (i.e., drawing in) and discharging a portion of the refrigerant stored in the reservoir 110, and a controller 240 configured to control an operation of the plurality of pumps (e.g., the pumps 231, 232, and 233) included in the pump array 230. The controller 240 may include a processor and a memory (e.g., processor 610 and memory 620 of FIG. 6 discussed in greater detail below).

In a non-limiting example, the controller 240 may determine that a board that requires cooling, where the cooling is to be accomplished by circulating the refrigerant stored in the reservoir 210 among the plurality of boards (e.g., the boards 221, 222, and 223). The controller 240 may identify a pump corresponding to the determined board among the plurality of pumps. That is, the corresponding pump may generate a current (i.e., move a flow quantity) within the refrigerant that tends to cause the refrigerant to flow through, towards, and/or around one of the boards. The controller 240 may increase a flow quantity of the refrigerant discharged from the identified pump. In the present specification, the pump corresponding to the board may refer to the pump that may generate the flow of refrigerant toward the corresponding board among the plurality of pumps included in the pump array 230. In an example, there may be one or more pumps of the plurality of pumps that correspond to one board (e.g., the board 221). The pump corresponding to the board may be disposed, in the reservoir 210, at a position to discharge the refrigerant toward the corresponding board. The pump corresponding (i.e., the corresponding pump) to the board may generate a respective flow of the refrigerant toward the corresponding board by discharging the refrigerant toward the corresponding board. The flow of the refrigerant generated by the corresponding pump may induce the circulation of the refrigerant along a surface of the board, and the corresponding board may be cooled by releasing heat from the surface of the corresponding board to the refrigerant.

In an example, there is a configuration where single pumps correspond to one respective, corresponding board. For example, the pump 231 may correspond to the board 221 and the pump 232 may correspond to the board 222. In this example, the controller 240 may increase the flow quantity of the refrigerant discharged from the pump 231 when cooling for the board 221 is required and may increase the flow quantity of the refrigerant discharged from the pump 232 when cooling for the board 222 is required.

In another example, there may be two or more pumps that correspond to a single board of the plurality of boards. For example, a target board may correspond to a first pump and a second pump. In other words, the flow of the refrigerant generated by the first pump may induce the circulation of the refrigerant along a surface of the target board, and the flow of the refrigerant generated by the second pump may also induce the circulation of the refrigerant along the surface of the target board. In this case, the controller 240 may increase the flow quantity of the refrigerant discharged from one or more of the first pump and/or the second pump when cooling for the target board is required.

In an example, the controller 240 may individually control the operation of the plurality of pumps (e.g., the pumps 231, 232, and 233). The controller 240 may individually control the flow quantity of the refrigerant discharged from each of the plurality of pumps.

In an example, the refrigerant may include an insulation fluid to prevent abnormalities in the operation of the electronic device 220. A part or all of the plurality of boards (e.g., the boards 221, 222, and 223) included in the electronic device 220 may be immersed in the refrigerant inside the reservoir 210. The refrigerant may transfer heat absorbed from the boards to an outside of the reservoir 210.

In an example, the number of pumps included in the pump array 230 (e.g., "5") may be equal to the number of boards included in the electronic device 220 (e.g., "5"), and each of the plurality of pumps (e.g., the pumps 231, 232, and 233) included in the electronic device 220 may be disposed at a position to discharge the refrigerant toward a different board among the plurality of boards (e.g., the boards 221, 222, and 223). In other words, there may be one pump corresponding to one board. In an example, the pump 231 may be disposed at a position to discharge the refrigerant toward the board 221, the pump 232 may be disposed at a position to discharge the refrigerant toward the board 222, and the pump 233 may be disposed at a position to discharge the refrigerant toward the board 223. For example, when it is determined that cooling for the board 221 is required, the controller 240 may increase the flow quantity of the refrigerant discharged from the pump 231 corresponding to the board 221 and may maintain the flow quantity of the refrigerant discharged from the other pumps (e.g., the pumps 232 and 233). However, the above example is only an example, and in an example, the number of pumps included in the pump array 230 and the number of boards included in the electronic device 220 for the immersion cooling system 201 may be different from each other, and there may be two or more pumps corresponding to one board.

Figure 3:
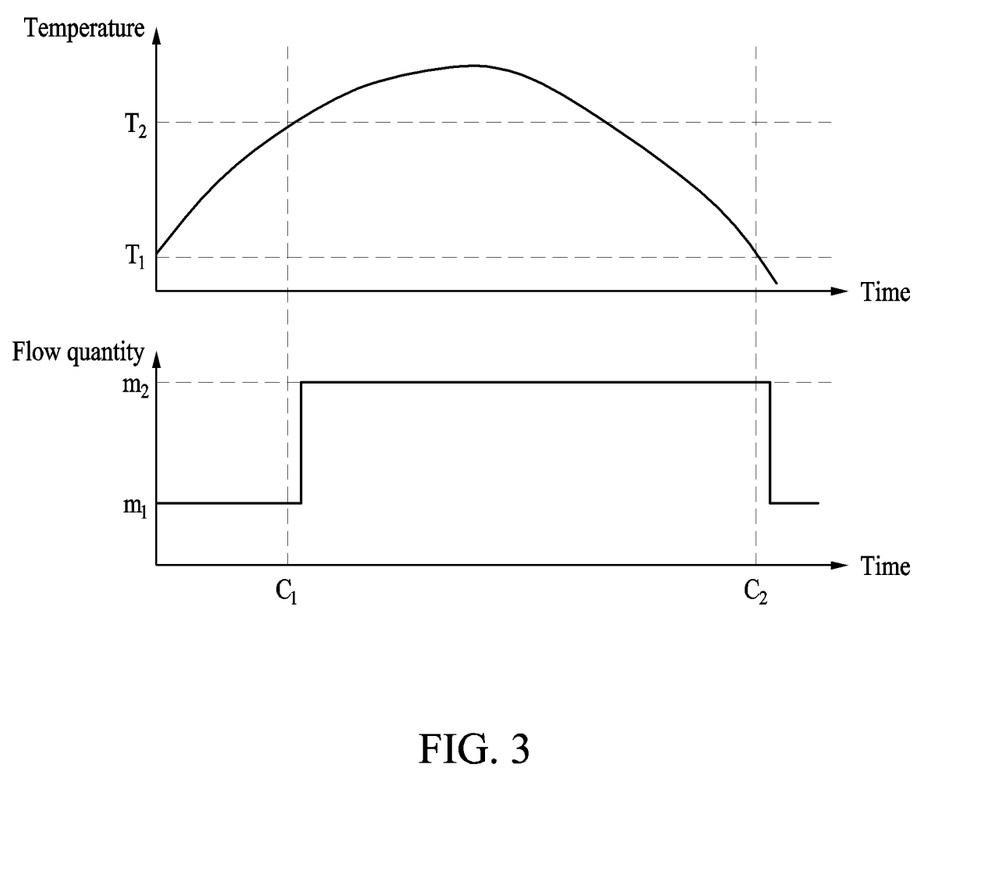
FIG. 3 illustrates an example method of controlling an immersion cooling system according to one or more embodiments.

FIG. 3 illustrates an example process of controlling a single pump in an immersion cooling system according to one or more embodiments.

Referring to FIG. 3, in a non-limiting example, an immersion cooling system (e.g., the immersion cooling system 101 of FIG. 1) may further include one or more temperature sensors that may measure the temperature of each of a plurality of boards included in an electronic device (e.g., the electronic device 120 of FIG. 1).

In an example, a controller (e.g., the controller 140 of FIG. 1) may determine that a board that requires cooling among the plurality of boards based on the measured temperature of each of the plurality of boards included in the electronic device. The controller may determine a flow quantity of a refrigerant that should be discharged from a single pump (e.g., the single pump 130 of FIG. 1) based on the determination that the board that requires cooling among the plurality of boards.

In an example, when a measured temperature of a board (e.g., the board 121 of FIG. 1) included in the electronic device increases to be equal to or higher than a threshold temperature (e.g., $T_2$) set for the corresponding board, the controller may determine that cooling is required for the corresponding board. The controller may increase the flow quantity of the refrigerant discharged from the single pump when it is determined that cooling is required for the corresponding board. For example, the controller may increase the flow quantity of the refrigerant discharged from the single pump by a preset flow quantity ($m_2-m_1$) in a time interval including a time point (e.g., $C_1$) when the measured temperature of the board increases to be equal to or greater than the threshold temperature (e.g., $T_2$) for the corresponding board. In an example, the time interval, including the time point, may indicate an interval of time extending from the corresponding time point to another point in time (i.e., after a preset time) based on the corresponding time point. In an example, the controller may increase the cooling performance of the immersion cooling system by increasing the flow quantity of the refrigerant discharged from the single pump, so that the controller may decrease the temperature of the corresponding board. The controller may decrease the flow quantity of the refrigerant discharged from the single pump by the preset flow quantity ($m_2-m_1$) in a time interval including a time point (e.g., $C_2$) when the measured temperature of the corresponding board decreases to be equal to or lower than a reference temperature (e.g., $T_1$) set for the corresponding board.

In an example, the controller may adjust the flow quantity of the refrigerant discharged from the single pump by measuring the temperature of the board. However, because the controller increases the flow quantity of the refrigerant discharged from the single pump only when the temperature of the board is equal to or higher than the threshold temperature set for the corresponding board, it is difficult to cool the corresponding board immediately when a power consumption of the board increases. This difficulty occurs because the surface temperature of the board tends to rise after the board's power consumption increases. Therefore, in the immersion cooling system according to an example, during the time interval from the time point (e.g., $C_1$) when the temperature of the board rises to be equal to or higher than the threshold temperature (e.g., $T_2$) set for the corresponding board to the time point (e.g., $C_2$) at which the temperature of the corresponding board decreases back to the reference temperature (e.g., $T_1$), the probability of a malfunction such as a soft error may increase due to the rise in a surface temperature of the corresponding board. In an example, the soft error may represent a phenomenon in which a malfunction occurs as neutrons falling in the air invade the board. When the temperature of the board increases by 10° C., the probability of the malfunction occurring in that board may increase by about 4 times. The occurrence of these malfunctions in the board may cause a fatal weakness (e.g., an error or malfunction) in an operation of a supercomputer or high-performance computing that performs more than billions of operations per second and that generates large amounts of heat energy as a byproduct of their operations.

Figure 4:
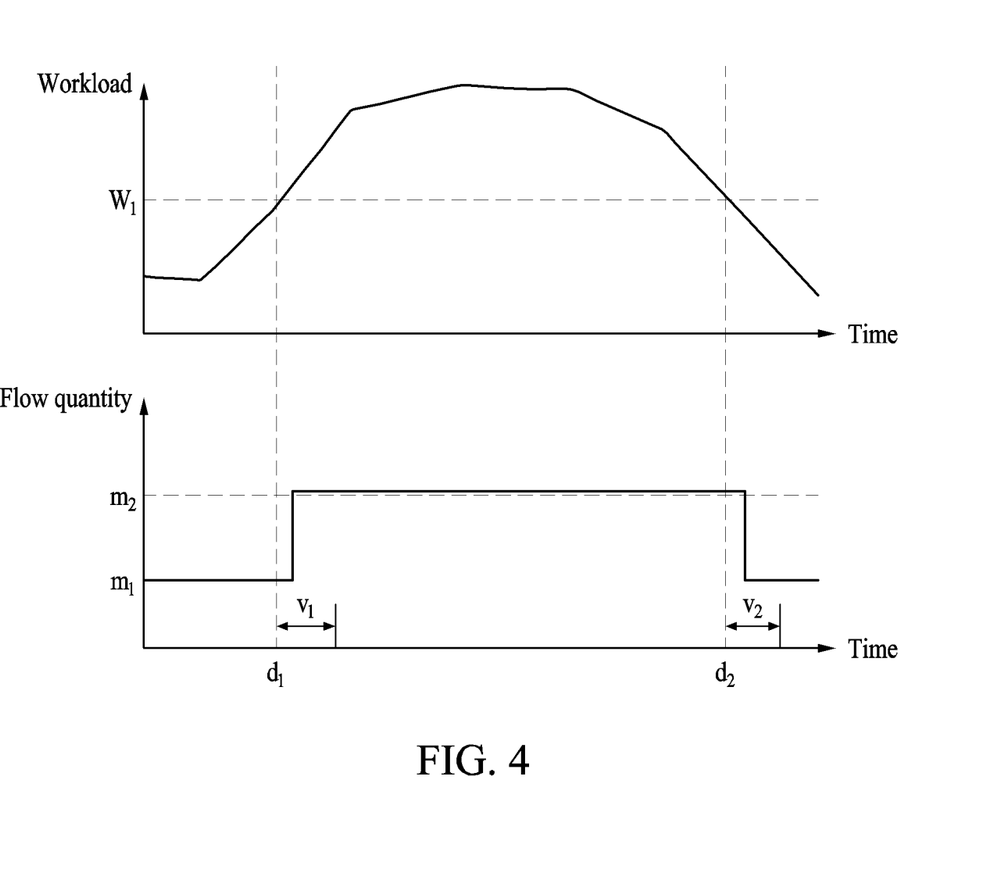
FIG. 4 illustrates an example method of controlling an immersion cooling system according to one or more embodiments.

FIG. 4 illustrates an example process of individually operating a plurality of pumps in an immersion cooling system according to one or more embodiments.

In an immersion cooling system (e.g., the immersion cooling system 201 of FIG. 2) according to an example, a controller (e.g., the controller 240 of FIG. 2) may determine a board requiring cooling among a plurality of boards based on a workload assigned to each of the plurality of boards included in an electronic device (e.g., the electronic device 220 of FIG. 2). The controller may identify a pump corresponding to the determined board and may increase a flow quantity of a refrigerant discharged from the identified pump.

The immersion cooling system according to an example may further include a scheduler that assigns a workload to each of the plurality of boards included in the electronic device. The scheduler may periodically transmit the workload assigned to each of the plurality of boards to the controller. The controller may periodically receive the workload assigned to each of the plurality of boards included in the electronic device from the scheduler.

In an example, the controller may determine whether a corresponding board requires cooling based on determining whether the workload assigned to the corresponding board is equal to or greater than a threshold workload set for the corresponding board, for each of the plurality of boards. The controller may determine that the corresponding board requires cooling when the workload assigned to the corresponding board increases to or above the threshold workload set for the corresponding board. The controller may determine that the corresponding board does not require cooling when the workload assigned to the corresponding board decreases to be less than the threshold workload set for the corresponding board.

In an example, the controller may individually set the threshold workload for each of the plurality of boards (e.g., the boards 221 and 222 of FIG. 2) included in the electronic device. For example, the controller may set the threshold workload for a first board included in the electronic device as a first threshold workload and may set the threshold workload for a second board that is different from the first board included in the electronic device as a second threshold workload. In an example, the first threshold workload may the same as or different than the second threshold workload. The controller may determine whether the first board requires cooling based on whether the workload assigned to the first board is scheduled to be equal to or greater than the first threshold workload set for the first board. The controller may determine whether the second board requires cooling based on determining whether the workload assigned to the second board is scheduled to be equal to or greater than the second threshold workload set for the second board.

Referring to FIG. 4, in a non-limiting example, the controller may increase the flow quantity of the refrigerant discharged from the pump corresponding to the corresponding board in a time interval that includes a time point when the workload assigned to the corresponding board reaches the threshold workload set for the corresponding board, when the workload assigned to the board included in the electronic device increases to be equal to or greater than the threshold workload set for the corresponding board. As described in greater detail above, the time interval including the time point may indicate an interval from the corresponding time point to a time point after a preset time based on the corresponding time point. In an example, the controller may increase the flow quantity of the refrigerant discharged from the pump corresponding to the corresponding board in the time interval (e.g., $v_1$) that includes the time point (e.g., $d_1$) when the workload assigned to the board included in the electronic device is scheduled to increase to be equal to or greater than the threshold workload (e.g., $W_1$) set for the corresponding board.

In an example, the controller may increase the flow quantity of the refrigerant discharged from the pump corresponding to the corresponding board by a preset flow quantity, when the workload assigned to the board included in the electronic device increases to be equal to or greater than the threshold workload set for the corresponding board. In an example, the controller may increase the flow quantity of the refrigerant discharged from the pump corresponding to the corresponding board by the preset flow quantity (e.g., $m_2-m_1$), when the scheduled workload assigned to the board included in the electronic device increases to be equal to or greater than the threshold workload (e.g., $W_1$) set for the corresponding board. When only one pump corresponds to the board, the controller may increase the flow quantity of the refrigerant discharged from the single pump itself corresponding to the corresponding board by the preset flow quantity (e.g., $m_2-m_1$). When a plurality of pumps corresponds to the board, the controller may increase a sum of flow quantities of the refrigerant discharged respectively from the plurality of pumps corresponding to the corresponding board by the preset flow quantity. In an example where there may be two pumps corresponding to the board and the preset flow quantity is 30 cubic feet per minute (cfm). In this example, the controller may increase the flow quantity of the refrigerant discharged from one pump corresponding to the board by 20 cfm and may increase the flow quantity of the refrigerant discharged from the other pump corresponding to the board by 10 cfm. In this case, when the workload assigned to the board included in the electronic device decreases to be less than the threshold workload set for the corresponding board, the controller may decrease the flow quantity of the refrigerant discharged from the pump corresponding to the corresponding board by the preset flow quantity (e.g., $m_2-m_1$) in the time interval that includes the time point (e.g., $d_2$) when the workload assigned to the corresponding board is less than the threshold workload set for the corresponding board.

In another example, instead of discretely increasing the flow quantity of the refrigerant discharged from the pump corresponding to the board, the controller may continuously increase the flow quantity of the refrigerant discharged from the pump corresponding to the board. More specifically, when a scheduled workload for a board increases to be equal to or greater than the threshold workload set for that board, the controller may increase the flow quantity of the refrigerant discharged from the pump corresponding to the corresponding board as the workload assigned to the corresponding board increases. The controller may increase the flow quantity of the refrigerant discharged from the pump corresponding to the corresponding board by a flow quantity proportional to a workload obtained by subtracting the threshold workload set for the corresponding board from the workload assigned to the corresponding board. In an example, the flow quantity of the refrigerant may be proportional (i.e., increased or decreased) to an intensity of a respective workload for the corresponding board from the workload assigned to the corresponding board. In an example, a first workload or a second workload may be assigned to the board included in the electronic device, and both the first workload and the second workload may be equal to or greater than the threshold workload (e.g., $W_1$) set for the corresponding board. In addition, the first workload may be greater than the second workload. In this example, the controller may control the pump corresponding to the corresponding board so that the flow quantity of the refrigerant discharged from the pump corresponding to the corresponding board when the first workload is assigned to the corresponding board is greater than the flow quantity of the refrigerant discharged from the pump corresponding to the corresponding board when the second workload is assigned to the corresponding board. In an example, when the workload assigned to the board is equal to or greater than the threshold workload set for that board, the controller may decrease the flow quantity of the refrigerant discharged from the pump corresponding to the board as the workload assigned to the corresponding board decreases.

Because the immersion cooling system, according to an example, may adjust the flow quantity of the refrigerant discharged from the pump corresponding to the corresponding board based on the workload assigned to the board, a temperature rise of the board may be limited in advance unlike in examples where an immersion cooling system reacts to the surface temperature of the board rising above a threshold temperature. In addition, in the example where, when it is determined that less than every board of the plurality of boards included in the electronic device requires cooling, the immersion cooling system may increase the flow quantity the pumps that correspond to the selected boards (i.e., less than every pump of the plurality of pumps) while maintaining the flow quantity of the refrigerant discharged from the remaining pumps, and therefore, unnecessary power consumption may be prevented.

Figure 5:
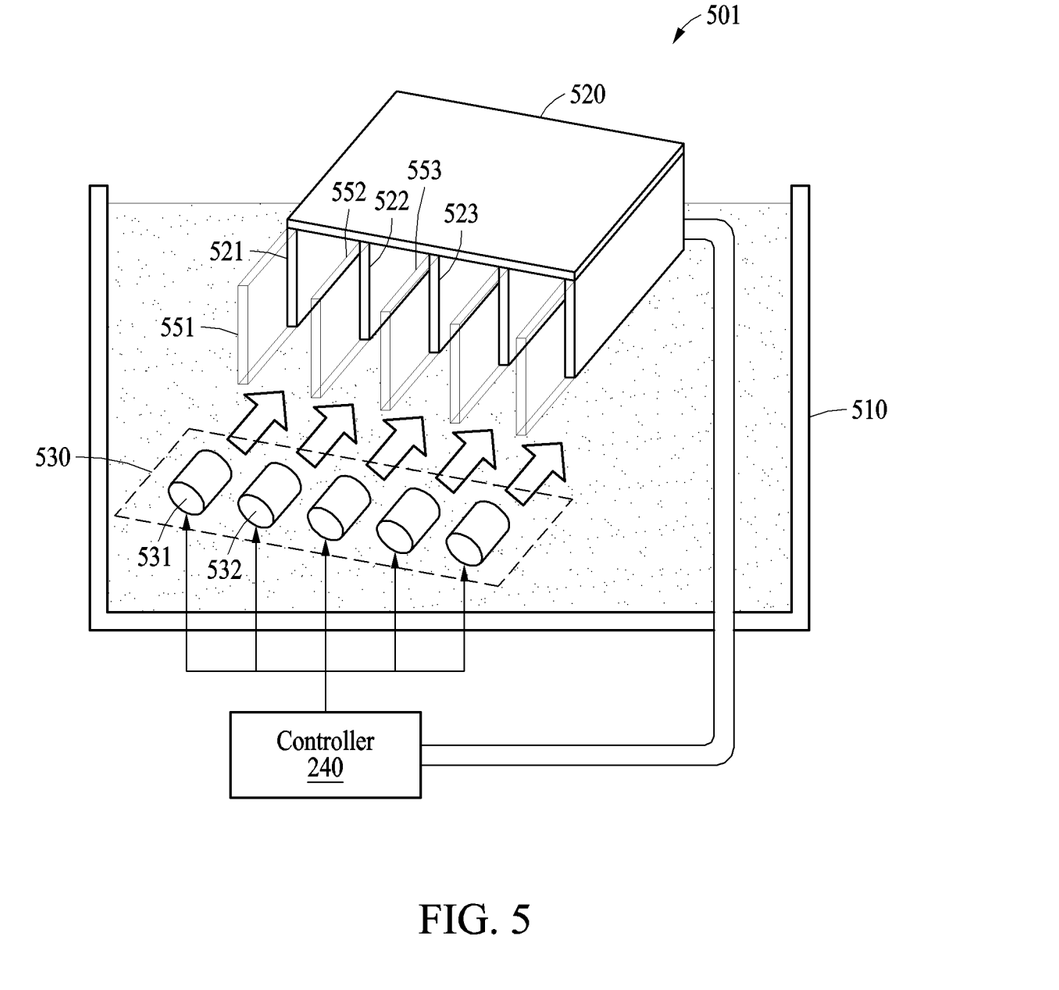
FIG. 5 illustrates example partition walls in an immersion cooling system according to one or more embodiments.

FIG. 5 illustrates an example electronic device in an immersion cooling system according to one or more embodiments.

Referring to FIG. 5, in a non-limiting example, an immersion cooling system 501 (e.g., the immersion cooling system 201 of FIG. 2) may further include a plurality of partition walls (e.g., partition walls 551, 552, and 553) formed between a plurality of boards to separate a flow of a refrigerant toward each of the plurality of boards included in an electronic device 520 (e.g., the electronic device 220 of FIG. 2).

In the immersion cooling system 501, a board 521 may correspond to a pump 531 and a board 522 may correspond to a pump 532. In other words, the pump 531 may generate the flow of the refrigerant toward the board 521 by drawing in and discharging a portion of the refrigerant stored in a reservoir 510, and the pump 532 may generate the flow of the refrigerant toward the board 522 by likewise drawing in and discharging the refrigerant. For example, when the pump 531 generates the flow of the refrigerant toward the board 521 by drawing in and discharging the refrigerant, the flow of the refrigerant generated by the pump 531 may be completely, or mostly, transmitted to the board 521 by the partition walls (e.g., the partition walls 551 and 552) disposed adjacent to the board 521. In other words, the partition walls (e.g., the partition walls 551 and 552) disposed adjacent to the board 521 may induce circulation of the refrigerant along a surface of the board 521 by allowing the refrigerant discharged from the pump 531 to be completely, or mostly, transmitted to the board 521 corresponding to the corresponding pump 531 and may prevent the refrigerant discharged from the pump 531 from being transmitted to other boards (e.g., boards 522 and 523) other than the board 521 corresponding to the corresponding pump 531.

In an example, a partition wall may be disposed in contact with the surface of the board. The partition wall 551, in an example, may be disposed in contact with the surface of the board 521 and the partition wall 552 may be disposed in contact with the surface of the board 522. However, the illustrated position where the partition wall is disposed is not limited thereto, and, in examples, the partition wall may be positioned in other areas where the flow of the refrigerant toward each of the plurality of boards can be separated.

In an example, the immersion cooling system 501 may further include one or more temperature sensors that may measure the temperature of each of the plurality of boards included in the electronic device 520. A controller may determine a flow quantity of the refrigerant discharged from the pump corresponding to the board determined to require cooling, considering both a workload assigned to each of the plurality of boards and a measured temperature of each of the plurality of boards.

For example, when the workload assigned to the board included in the electronic device 520 increases to be equal to or greater than a threshold workload set for the corresponding board, the controller may increase the flow quantity of the refrigerant discharged from the pump corresponding to the corresponding board by a preset flow quantity. At this time, in a state where the flow quantity of the refrigerant discharged from the pump corresponding to the corresponding board is increased by the preset flow quantity, when a surface temperature of the corresponding board also increases so that the surface temperature of the corresponding board increases to be equal to or higher than the threshold temperature set for the corresponding board, the controller may additionally increase the flow quantity of the refrigerant discharged from the pump corresponding to the corresponding board. In this method, the immersion cooling system 501 may also control the flow quantity of the refrigerant discharged from the pump corresponding to the corresponding board, considering the workload assigned to the board included in the electronic device and the measured temperature of the board.

Figure 6:
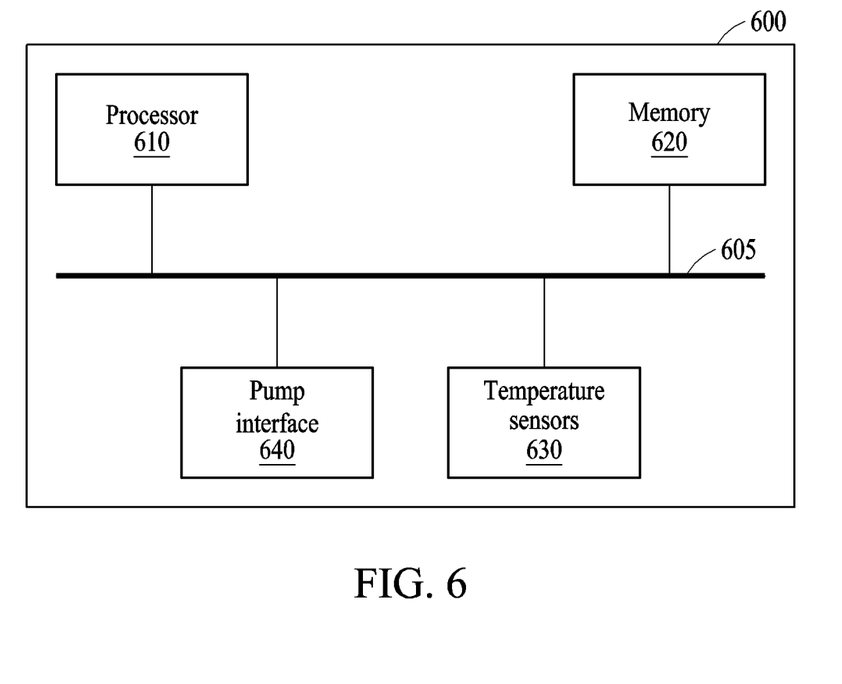
FIG. 6 illustrates an example electronic apparatus with immersion cooling according to one or more embodiments.

FIG. 6 illustrates an example electronic apparatus (or system) with immersion cooling according to one or more embodiments.

Referring to FIG. 6, in a non-limiting example, an electronic apparatus 600 may include a processor 610, a memory 620, temperature sensors 630, and a pump interface 640. The processor 610, memory 620, temperature sensors 630, and pump interface 640 may be connected via a bus 605. In an example, the temperature sensors 630 may be provided in the reservoir 110, on or within the boards (e.g., boards 121 or 122 of the plurality of boards 120 of FIG. 1) and communicate with the processor. The temperature sensors may be the temperature sensors that measure one or more temperatures of the surfaces of the boards described in greater detail above with respect to FIG. 1. The pump interface 640 may be a link between the controller (e.g., the processor 610) and the one or more pumps (e.g., pumps 230 of FIG. 2) where the controller may control a speed or discharge of each pump of the plurality of pumps (e.g., pumps 231, 232, and 233 of FIG. 2).

For example, the electronic apparatus 600 may be the controller 140 described above with reference to FIG. 1. The processor 610 may be configured to execute computer-readable instructions, which when executed by the processor 610, to configure the processor 610 to perform one or more or all operations and/or methods involving the control of the one or more pumps or perform any one or any combination of the operations and/or methods described herein. The processor 610 may include any one or a combination of two or more of, for example, a central processing unit (CPU), a processor core, a multi-core processor, and a multiprocessor. The processor 610 may also execute other computer-readable instructions, programs, or applications to control other functionalities of the electronic device.

The memory 620 may be configured to store, or store, any of the computer-readable instructions described herein. The memory 620 may be a volatile or nonvolatile memory.

The memory 620 may include, for example, random-access memory (RAM), dynamic random-access memory (DRAM), static random-access memory (SRAM), or other types of non-volatile memory known in the art.

The controllers, pumps, boards, processor, memory, temperature sensors, controllers 140 and 240, processor 610, memory 620, pump interface 640, temperature sensors 630, pumps 130, 231, 232, 233, 531, and 532 described herein and disclosed herein described with respect to FIGS. 1-6 are implemented by or representative of hardware components. As described above, or in addition to the descriptions above, examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. As described above, or in addition to the descriptions above, example hardware components may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-6 that perform the operations described in this application are performed by computing hardware, for example, by one or more processors or computers, implemented as described above implementing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions herein, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media, and thus, not a signal per se. As described above, or in addition to the descriptions above, examples of a non-transitory computer-readable storage medium include one or more of any of read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and/or any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, in addition to the above and all drawing disclosures, the scope of the disclosure is also inclusive of the claims and their equivalents, i.e., all variations within the scope of the claims and their equivalents are to be construed as being included in the disclosure.

What is claimed is:

1. An immersion cooling system, comprising:
   an electronic device comprising a plurality of boards, the electronic device being configured in the immersive cooling system to be immersed in refrigerant that a reservoir is configured to accommodate;
   a pump array comprising a plurality of pumps disposed inside the reservoir, each pump of the plurality of pumps configured to individually generate a flow of the refrigerant by performing a discharging of the refrigerant; and
   a controller, the controller being configured to:
   individually control an operation of each pump of the plurality of pumps;
   determine, for each board of the plurality of boards, whether a corresponding board, of the plurality of boards, requires cooling based on a respective workload for the corresponding board being determined to be greater than or equal to a respective threshold workload set for the corresponding board; and
   increase a respective flow quantity of the refrigerant discharged from a respective pump corresponding to the corresponding board in a corresponding time interval, the corresponding time interval including a time point at which the respective workload reaches the respective threshold workload.

2. The immersion cooling system of claim 1, wherein the refrigerant comprises an insulation fluid, the refrigerant having characteristics to release heat absorbed from a surface of the determined board.

3. The immersion cooling system of claim 1, wherein a total number of the plurality of pumps of the pump array is equal to a total number of the plurality of boards of the electronic device, and wherein each of the plurality of pumps is disposed at a position to discharge the refrigerant toward a respective board among the plurality of boards.

4. The immersion cooling system of claim 1, wherein the controller is further configured to:
periodically receive the respective workload assigned to each of the plurality of boards.

5. The immersion cooling system of claim 4, wherein the determination of whether the corresponding board requires cooling is performed for each board of the plurality of boards.

6. The immersion cooling system of claim 5, wherein the controller is further configured to individually set the respective threshold workload for each of the corresponding boards.

7. The immersion cooling system of claim 1, wherein the controller is further configured to increase the respective flow quantity of the respective pump corresponding to one of the corresponding boards by a preset flow quantity.

8. The immersion cooling system of claim 1, wherein the controller is further configured to increase a sum of flow quantities of multiple pumps corresponding to one of the corresponding boards by a preset flow quantity.

9. The immersion cooling system of claim 4, wherein the controller is further configured to increase the respective flow quantity of the respective pump corresponding to one of the corresponding boards as the respective workload assigned to the one corresponding board increases.

10. The immersion cooling system of claim 4, wherein the controller is further configured to increase the respective flow quantity of the respective pump corresponding to one of the corresponding boards proportional to a workload obtained by subtracting the respective threshold workload set for the corresponding board from the respective workload assigned to the one corresponding board.

11. The immersion cooling system of claim 1, further comprising:
a plurality of partition walls formed between the plurality of boards to separate flows of the refrigerant toward each of the plurality of boards.

12. A method, the method comprising:
determining whether a corresponding board of a plurality of boards requires cooling through circulation of a refrigerant among the plurality of boards immersed in the refrigerant that a reservoir is configured to accommodate based on a respective workload assigned to the corresponding board being greater than or equal to a threshold workload set for the corresponding board, for each of the plurality of boards and further based on a workload assigned to each of the plurality of boards; and
increasing a respective flow quantity of the refrigerant discharged from a respective pump corresponding to the corresponding board in a corresponding time interval, the corresponding time interval including a time point at which the respective workload reaches the respective threshold workload.

13. The method of claim 12, wherein the workload assigned to each of the plurality of boards is periodically updated.

14. The method of claim 12, wherein the threshold workload is set individually for each corresponding board.

15. The method of claim 12, wherein the increasing of the flow quantity of the refrigerant comprises:
increasing the respective flow quantity of the respective pump corresponding to one of the corresponding boards by a preset flow quantity.

16. The method of claim 12, wherein the increasing of the flow quantity of the refrigerant comprises:
increasing the respective flow quantity of the respective pump corresponding to one of the corresponding boards as the respective workload assigned to the one corresponding board increases.

17. The method of claim 12, wherein a plurality of partition walls is formed between the plurality of boards to separate flows of the refrigerant toward respective ones of the plurality of boards.

* * * * *